United States Patent
Wu et al.

(10) Patent No.: US 11,503,708 B2
(45) Date of Patent: Nov. 15, 2022

(54) RESIN COMPOSITION, PREPREG, AND PRINTED CIRCUIT BOARD

(71) Applicant: ITEQ CORPORATION, Hsinchu County (TW)

(72) Inventors: Yen-Hsing Wu, Hsinchu County (TW); Chen-Hao Chang, Hsinchu County (TW)

(73) Assignee: ITEQ CORPORATION, Hsinchu County (TW)

(*) Notice: Subject to any disclaimer, the term of this patent is extended or adjusted under 35 U.S.C. 154(b) by 0 days.

(21) Appl. No.: 17/204,962

(22) Filed: Mar. 18, 2021

(65) Prior Publication Data

US 2021/0298169 A1   Sep. 23, 2021

Related U.S. Application Data

(60) Provisional application No. 62/992,156, filed on Mar. 20, 2020.

(51) Int. Cl.
*H05K 1/03* (2006.01)

(52) U.S. Cl.
CPC ....... *H05K 1/036* (2013.01); *H05K 2201/012* (2013.01); *H05K 2201/0209* (2013.01); *H05K 2201/0212* (2013.01)

(58) Field of Classification Search
CPC .... H05K 1/0353; H05K 1/036; H05K 1/0366; H05K 1/0373
See application file for complete search history.

(56) References Cited

U.S. PATENT DOCUMENTS

| 5,670,250 A | 9/1997 | Sanville, Jr. |
| 2005/0123739 A1 | 6/2005 | Chen-Yang et al. |
| 2017/0343930 A1 | 11/2017 | Nakajima et al. |
| 2020/0115572 A1* | 4/2020 | Liu ................... H05K 3/0094 |

FOREIGN PATENT DOCUMENTS

| CN | 105467752 A | 4/2016 |
| CN | 110627073 A | 12/2019 |
| JP | 2005163006 A | 6/2005 |
| JP | 200831409 A | 2/2008 |
| JP | 200993876 A | 4/2009 |
| TW | 202003662 A | 1/2020 |

\* cited by examiner

*Primary Examiner* — Jeremy C Norris
(74) *Attorney, Agent, or Firm* — Li & Cai Intellectual Property Office

(57) ABSTRACT

A resin composition, a prepreg, and a printed circuit board are provided. The resin composition is used to form a dielectric substrate layer. The resin composition includes a polymeric based material and fillers. Based on a total volume of the resin composition being 100 vol %, the resin composition includes 10 vol % to 60 vol % of the polymeric based material and 1 vol % to 80 vol % of the fillers. The fillers include hollow fillers, and the hollow fillers include a first hollow filler. A material of the first hollow filler is silicon dioxide.

14 Claims, 1 Drawing Sheet

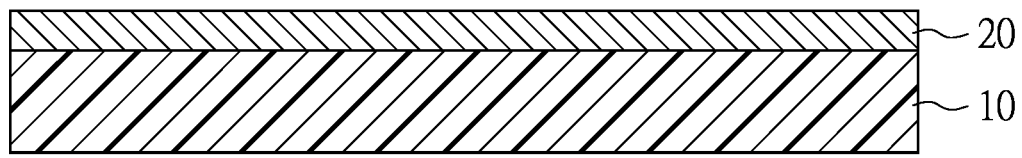

RESIN COMPOSITION, PREPREG, AND PRINTED CIRCUIT BOARD

CROSS-REFERENCE TO RELATED PATENT APPLICATION

This application claims priority to the U.S. Provisional Patent Application Ser. No. 62/992,156 filed on Mar. 20, 2020, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a resin composition, a prepreg, and a printed circuit board, and more particularly to a resin composition, a prepreg, and a printed circuit board having a low dielectric constant and a low dielectric loss.

BACKGROUND OF THE DISCLOSURE

In order to meet demands of high frequency transmission, requirements for a high frequency transmission system and wireless communication equipment in the industry are constantly increased. Generally, a circuit assembly includes a conductive metal layer and a dielectric substrate layer. To meet the demands of high frequency transmission, the dielectric substrate layer needs to have a low dielectric constant (Dk), a low dielectric loss (Df), and a low passive intermodulation (PIM).

In the conventional technology, borosilicate glass hollow microspheres (or borosilicate microspheres for short) can be added into a material to form the dielectric substrate layer. An addition of the borosilicate microspheres can decrease a dielectric constant of the dielectric substrate layer, increase mechanical strength of the dielectric substrate layer, and allow the dielectric substrate layer to be light-weighted.

However, a material of the borosilicate microspheres contains various metal oxides, such as $Na_2O$, $B_2O_3$, or $Fe_2O_3$. These metal oxides lower a melting point of the dielectric substrate layer, thereby decreasing a thermal stability of a printed circuit board. Moreover, $Na_2O$ and $Fe_2O_3$ increase the dielectric loss of the dielectric substrate layer. Therefore, an added amount of the borosilicate microspheres is without an upper limit In the conventional technology, the borosilicate microspheres can be treated by an acid process or a base process, so as to alleviate negative influences on the dielectric substrate layer. However, impurities in the material of the borosilicate microspheres cannot be completely removed, which causes the dielectric loss of the dielectric substrate layer to increase along with the added amount of the borosilicate microspheres. Therefore, the dielectric substrate on the market still has room for improvement.

SUMMARY OF THE DISCLOSURE

In response to the above-referenced technical inadequacies, the present disclosure provides a resin composition, a prepreg, and a printed circuit board.

In one aspect, the present disclosure provides a resin composition. The resin composition is used to form a dielectric substrate layer. Based on a total volume of the resin composition being 100 vol %, the resin composition includes 10 vol % to 60 vol % of a polymeric based material and 1 vol % to 80 vol % of fillers. The fillers include hollow fillers. The hollow fillers include a first hollow filler. A material of the first hollow filler is silicon dioxide.

In certain embodiments, the first hollow filler has an average particle size of 5 μm to 20 μm.

In certain embodiments, the first hollow filler has a specific weight of 0.3 to 1.5.

In certain embodiments, the first hollow filler has a purity of higher than or equal to 99.8%.

In certain embodiments, the hollow fillers include a second hollow filler. A material of the second hollow filler is selected from the group consisting of borosilicate, glass, white sand, pulverized fuel ash, and metal silicate.

In certain embodiments, a volume ratio of the first hollow filler to the second hollow filler ranges from 0.8 to 5.

In certain embodiments, the hollow fillers include a third hollow filler, and a material of the third hollow filler is selected from the group consisting of acrylonitrile, vinylidene chloride, a phenol resin, an epoxy resin, and a urea resin.

In certain embodiments, the fillers include solid fillers, and the fillers include 1 vol % to 79 vol % of the solid fillers and 1 vol % to 79 vol % of the hollow fillers.

In certain embodiments, the solid fillers include a first solid filler. A material of the first solid filler is selected from the group consisting of: silicon dioxide, titanium dioxide, strontium titanate, barium titanate, potassium titanate, zinc silicate, magnesium silicate, calcium silicate, aluminum nitride, boron nitride, silicon nitride, silicon carbide, aluminum oxide, magnesium oxide, zirconium oxide, beryllium oxide, zinc oxide, aluminum hydroxide, magnesium hydroxide, zinc borate, glass, kaolinite, talcum powder, mica powder, hydrotalcite, mullite, and quartz.

In certain embodiments, the solid fillers include a second solid filler. A material of second solid filler is selected from the group consisting of: polytetrafluoroethylene powder, polyphenylene sulfide powder, polystyrene powder, polyethylene powder, polypropylene powder, liquid crystal polymer powder, polyetheretherketone powder, graphite powder, and graphene powder.

In another aspect, the present disclosure provides a prepreg. The prepreg is formed by immersing a reinforcing substrate into the resin composition mentioned previously.

In yet another aspect, the present disclosure provides a printed circuit board. The printed circuit board includes a dielectric substrate layer and a conductive metal layer formed on the dielectric substrate layer. The dielectric substrate layer is formed from the prepreg mentioned previously.

In certain embodiments, a dielectric constant of the dielectric substrate layer at 10 GHz is lower than 3.4, and a dielectric loss of the dielectric substrate layer at 10 GHz is lower than 0.0045.

In certain embodiments, a passive intermodulation of the dielectric substrate layer is lower than or equal to −155 dBc.

Therefore, in the resin composition, the prepreg and the printed circuit board provided by the present disclosure, by virtue of "1 vol % to 80 vol % of the fillers including hollow fillers" and "a material of the first hollow filler being silicon dioxide", the thermal stability of the prepreg and the dielectric substrate layer can be enhanced, and the dielectric loss of the prepreg and the dielectric substrate layer can be reduced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIG. 1 is a cross-sectional side view of a printed circuit board of the present disclosure.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

To overcome deficiencies of a conventional dielectric substrate layer with respect to thermal stability and dielectric properties, the present disclosure provides a resin composition having a good thermal stability and good dielectric properties (i.e., having a low dielectric constant and a low dielectric loss). The resin composition can be used to form a prepreg, and further form a dielectric substrate layer by thermocompression. The dielectric substrate layer has a good thermal stability and good dielectric properties.

The resin composition of the present disclosure includes a polymeric based material and fillers. The fillers are uniformly dispersed in the polymeric based material. In the present embodiment, based on a total volume of the resin composition being 100 vol %, the resin composition includes 10 vol % to 60 vol % of the polymeric based material and 1 vol % to 80 vol % of the fillers. Therefore, the fillers can prevent the dielectric substrate layer from hardening or shrinking, and enhance heat dissipation, bending resistance, and mechanical strength of the dielectric substrate layer.

The fillers of the present disclosure include hollow fillers. Air is sealed in a hollow part of the hollow fillers. Since a dielectric constant of air is low (i.e., Dk=1), an addition of the hollow fillers can decrease a dielectric constant of the dielectric substrate layer.

The hollow fillers include a first hollow filler. A material of the first hollow filler is silicon dioxide. A purity of the first hollow filler is higher than or equal to 99%. Preferably, the purity of the first hollow filler is higher than or equal to 99.8%. In other words, an amount of impurities in the material of the first hollow filler is lower than 0.2 wt %. Specifically, the material of the first hollow filler has a metal content lower than 0.2 wt % (e.g., an amount of sodium being lower than 0.1 wt % and an amount of calcium being lower than 0.1 wt %), so as to prevent metal oxides from deteriorating the thermal stability and the dielectric loss of the resin composition.

A particle size of the first hollow filler can influence properties of the resin composition. For example, an air volume sealed in the first hollow filler and the mechanical strength of the first hollow filler are influenced by an average particle size, a specific weight, and a specific surface area of the first hollow filler. The more air that is sealed in the first hollow filler, the lower the dielectric constant of the dielectric substrate layer is. However, when a shell thickness of the first hollow filler is decreased so as to increase a total air volume sealed in the first hollow filler, the mechanical strength of the first hollow filler may be decreased correspondingly.

Accordingly, after taking various characteristics of the first hollow filler into consideration, the average particle size of the first hollow filler ranges from 0.1 μm to 100 μm. Preferably, the average particle size of the first hollow filler ranges from 1 μm to 50 μm. More preferably, the average particle size of the first hollow filler ranges from 5 μm to 20 μm. When the particle size of the first hollow filler is within the above-mentioned ranges, the first hollow filler does not agglomerate easily. When the specific weight of the first hollow filler ranges from 0.2 to 2.0, the first hollow filler has a good thermal insulating property and a good pressure resistance. Further, a thermal conductivity of the dielectric substrate layer may not be negatively influenced. Preferably, the specific weight of the first hollow filler ranges from 0.3 to 1.5. The specific surface area of the first hollow filler ranges from 1 $m^2/g$ to 5 $m^2/g$.

In some embodiments, a dielectric constant of the first hollow filler ranges from 1.2 to 3, and a dielectric loss of the first hollow filler is lower than 0.001.

In addition, the hollow fillers can further include a second hollow filler and/or a third hollow filler. An addition of the second hollow filler and the third hollow filler can adjust a thermal expansion constant and the mechanical strength of the resin composition. Specifically, a volume ratio of the first hollow filler to the second hollow filler ranges from 0.8 to 5, and a volume ratio of the first hollow filler to the third hollow filler ranges from 1 to 8.

A material of the second hollow filler is an inorganic material other than silicon dioxide. For example, the material of the second hollow filler is selected from the group consisting of: borosilicate, glass, white sand, pulverized fuel ash, and metal silicate, but is not limited thereto.

A material of the third hollow filler is an organic material. For example, the material of the third hollow filler is selected from the group consisting of: acrylonitrile, vinylidene chloride, a phenol resin, an epoxy resin, and an urea resin, but is not limited thereto.

In addition to the hollow fillers, the fillers of the present disclosure can further include solid fillers to adjust the dielectric constant, the dielectric loss, and the thermal expansion constant. Based on a total volume of the resin composition being 100 vol %, the solid fillers are present in an amount ranging from 1 vol % to 79 vol % and the hollow fillers are present in an amount ranging from 1 vol % to 79 vol %. Shapes of the solid fillers are not restricted, so long as the solid fillers do not damage an electronic device that is in contact with the dielectric substrate layer. For example, the solid fillers can be spherical fillers, corniculate fillers, platy fillers, acicular fillers, or fibrous fillers, but is not limited thereto.

The solid fillers can include a first solid filler and/or a second solid filler. A material of the first solid filler is an inorganic material. The material of the first solid filler is selected from the group consisting of: silicon dioxide, titanium dioxide, strontium titanate, barium titanate, potassium titanate, zinc silicate, magnesium silicate, calcium silicate, aluminum nitride, boron nitride, silicon nitride, silicon carbide, aluminum oxide, magnesium oxide, zirconium oxide, beryllium oxide, zinc oxide, aluminum hydroxide, magnesium hydroxide zinc borate, glass, kaolinite, talcum powder, mica powder, hydrotalcite, mullite, and quartz.

A material of the second solid filler is an organic material. The material of the second solid filler is selected from the group consisting of: polytetrafluoroethylene powder, polyphenylene sulfide powder, polystyrene powder, polyethylene powder, polypropylene powder, liquid crystal polymer powder, polyetheretherketone powder, graphite powder, and graphene powder.

The polymeric based material can include a base resin, and further can be mixed with other resins. The base resin usually is a thermosetting resin or a thermoplastic resin. For example, the base resin can be a polyphenylene ether resin, an epoxy resin, a cyanurate resin, a bismaleimide resin, a polyimide resin, a phenolic resin, a furan resin, a xylene formaldehyde resin, a ketone formaldehyde resin, an urea resin, a melamine resin, an aniline resin, an alkyd resin, an unsaturated polyester resin, a diallyl phthalate resin, a triallyl cyanurate resin, a triazine resin, a polyurethane resin, a polyetheretherketone resin, a silicone resin, a polybutadiene resin, a polyisoprene resin, a polystyrene resin, a polyethylene resin, a polypropylene resin, a fluoropolymer resin, a polytetrafluoroethylene resin, or a thermoplastic liquid crystal polymer resin.

In some embodiments, the polymeric based material includes a polyphenylene ether resin, a polybutadiene resin, a hardener, a flame retardant, and a solvent. Based on a total volume of the polymeric base resin being 100 parts by weight (phr), an amount of the polyphenylene ether resin ranges from 40 phr to 70 phr, an amount of the polybutadiene resin ranges from 5 phr to 30 phr, an amount of the hardener ranges from 15 phr to 30 phr, and an amount of the solvent ranges from 10 phr to 50 phr.

The polyphenylene ether resin can be a unitary polyphenylene ether resin or a mixture of various kinds of polyphenylene ether resins. Further, the unitary polyphenylene ether resin or the various kinds of polyphenylene ether resins can be optionally modified. That is, the polyphenylene ether resin can have modified groups.

The hardener can be triallyl isocyanurate (TRIC), triallyl cyanurate (TAC), or trimethyl allyl isocyanate (TMAIC), but is not limited thereto.

The flame retardant can be a phosphorus flame retardant or a nitrogen flame retardant, but is not limited thereto.

The solvent can be toluene, acetone, or butanone, but is not limited thereto.

Referring to FIG. 1, FIG. 1 is a cross-sectional side view of the printed circuit board of the present disclosure. The printed circuit board includes a dielectric substrate layer 10 and a conductive metal layer 20 disposed on the dielectric substrate layer 10. The dielectric substrate layer 10 is formed from a prepreg by thermocompression. The prepreg is formed by immersing a reinforcing substrate into the resin composition mentioned previously.

The reinforcing substrate can be a woven fabric or a nonwoven fabric. The woven fabric can be weaved from glass fibers, metal fibers, liquid crystal polymer fibers, synthetic fibers, or natural fibers. For example, a material of the glass fibers can be E glass, R glass, ECR glass, C glass or Q glass. A material of the liquid crystal polymer fibers can be fully aromatic polyamide, fully aromatic polyester, or polybenzoxazole. A material of the synthetic fibers can be polyvinyl alcohol, polyester, polyacrylic acid, or polytetrafluoroethylene (PTFE). A material of the natural fibers can be cotton cloth, linen cloth, or felt. A material of the nonwoven fabric can be PTFE, quartz, aluminum oxide, aluminum nitride, glass material, liquid crystal polymer, or any combination thereof. Moreover, at least one of chopped PTFE fibers, chopped glass fibers, and a filling material is blended in the nonwoven fabric. A material of the filling material can be boron nitride or fused silica.

Referring to Table 1, components of the resin composition in each of Examples 1 to 6 are listed therein. Unless otherwise indicated, units in Table 1 are parts by weight. The reinforcing substrate is immersed into the resin composition in each of Examples 1 to 6, and is then semi-cured to form the prepreg. After thermo compressing the prepreg, the dielectric substrate layer is formed. Subsequently, a transition temperature (Tg), a coefficient of thermal expansion (CTE), a storage modulus, a moisture absorption rate, a dielectric constant (Dk), a dielectric loss (Df), and a flammability of the dielectric substrate layer are measured and listed in Table 1.

In Table 1, a purity of a material of the silicon dioxide hollow microspheres (D50=7.5 μm) is higher than or equal to 99.8%, and said material has a metal content lower than 0.2 wt % (an amount of sodium being lower than 0.1 wt % and an amount of calcium being lower than 0.1 wt %).

TABLE 1

| | | Example | | | | | |
|---|---|---|---|---|---|---|---|
| | (phr) | 1 | 2 | 3 | 4 | 5 | 6 |
| Polymeric based material | Polyphenylene ether resin | 24 | 24 | 24 | 24 | 24 | 24 |
| | Hardener | 11 | 11 | 11 | 11 | 11 | 11 |
| | Polybutadiene | 5 | 5 | 5 | 5 | 5 | 5 |
| | Flame retardant | 5 | 5 | 5 | 5 | 5 | 5 |
| | Catalyst | 0.75 | 0.75 | 0.75 | 0.75 | 0.75 | 0.75 |

TABLE 1-continued

| (phr) | | Example | | | | | |
|---|---|---|---|---|---|---|---|
| | | 1 | 2 | 3 | 4 | 5 | 6 |
| Hollow fillers | SiO₂ hollow microspheres (D50 = 7.5 μm) | 13.5 | 40 | 65 | 85 | 13.5 | 85 |
| | (vol %) | 60% | 55% | 50% | 45% | 60% | 45% |
| Solid fillers | E-glass | 15 | 15 | 15 | 15 | 10 | 10 |
| | (vol %) | 15% | 20% | 25% | 30% | 15% | 30% |
| Transition temperature (° C.) | | 205 | 215 | 225 | 225 | 204 | 222 |
| CTE (ppm/° C.) | | 2.45 | 1.29 | 0.64 | 0.64 | 2.81 | 1.21 |
| Storage modulus (GPa) | | 8.8 | 10.5 | 12 | 12 | 7.5 | 9.1 |
| Moisture absorption rate (%) | | 0.41 | 0.45 | 0.5 | 0.5 | 0.52 | 0.63 |
| Dk (10 GHz) | | 3.03 | 2.95 | 2.85 | 2.85 | 2.83 | 2.58 |
| Df (10 GHz) | | 0.0031 | 0.0032 | 0.0033 | 0.0033 | 0.0028 | 0.003 |
| Flammability | | V0 | V0 | V0 | V0 | V0 | V0 |

According to results of Table 1, an addition of the silicon dioxide hollow microspheres decreases the dielectric constant of the dielectric substrate layer. In addition, the dielectric loss of the dielectric substrate layer is not obviously increased and remains lower than 0.0035. Preferably, the dielectric loss of the dielectric substrate layer can be lower than or equal to 0.0033.

According to results of Table 1, when the silicon dioxide hollow microspheres is present in a large amount in the resin composition, the transition temperature and the storage modulus of the dielectric substrate layer can be increased. In other words, the addition of the silicon dioxide hollow microspheres can enhance the thermal stability of the dielectric substrate layer.

Referring to Table 2, components of the resin composition in each of Examples 7 to 10 are listed therein. Unless otherwise indicated, units in Table 2 are parts by weight. The reinforcing substrate is immersed into the resin composition in each of Examples 7 to 10 and is then semi-cured to form the prepreg. After thermo compressing the prepreg, the dielectric substrate layer is formed. Subsequently, the transition temperature, the coefficient of thermal expansion, the moisture absorption rate, the dielectric constant, the dielectric loss, and the flammability of the dielectric substrate layer are measured and listed in Table 2.

In Table 2, the purity of the material of the silicon dioxide hollow microspheres (D50=7.5 μm) is higher than or equal to 99.8%, and said material has a metal content lower than 0.2 wt % (an amount of sodium being lower than 0.1 wt % and an amount of calcium being lower than 0.1 wt %). A material of glass hollow microspheres (D50=20 μm) contains 2.5 wt % of sodium metal and 4.8 wt % of calcium metal. A purity of a material of spherical SiO₂ fillers (D50=5 μm) is higher than or equal to 99.8%, and said material has a metal content in an amount lower than 0.2 wt % (an amount of sodium being lower than 0.1 wt % and an amount of calcium being lower than 0.1 wt %).

TABLE 2

| (phr) | | Example | | | |
|---|---|---|---|---|---|
| | | 7 | 8 | 9 | 10 |
| Polymeric based material | Polyphenylene ether resin | 24 | 24 | 24 | 24 |
| | Hardener | 11 | 11 | 11 | 11 |
| | Polybutadiene | 5 | 5 | 5 | 5 |
| | Flame retardant | 5 | 5 | 5 | 5 |
| | Catalyst | 0.75 | 0.75 | 0.75 | 0.75 |

TABLE 2-continued

| (phr) | | Example | | | |
|---|---|---|---|---|---|
| | | 7 | 8 | 9 | 10 |
| Hollow fillers | Silicon dioxide hollow microspheres (D50 = 7.5 μm) | 7 | 20 | 10 | 30 |
| | (vol %) | 60% | 50% | 50% | 50% |
| | Glass hollow microspheres (D50 = 20 μm) | — | — | 3.5 | — |
| | (vol %) | — | — | 13% | — |
| Solid fillers | Spherical SiO₂ fillers (D50 = 5 μm) | 45 | 45 | 45 | 45 |
| | (vol %) | 16% | 26% | 13% | 26% |
| Transition temperature (° C.) | | 208 | 215 | 215 | 215 |
| CTE (ppm/° C.) | | 1.55 | 1.29 | 1.22 | 0.73 |
| Moisture absorption rate (%) | | 0.42 | 0.33 | 0.35 | 0.33 |
| Dk (10 GHz) | | 3.29 | 3.18 | 3.07 | 3.12 |
| Df (10 GHz) | | 0.0027 | 0.0029 | 0.003 | 0.003 |
| Flammability | | V0 | V0 | V0 | V0 |

According to results in Table 2, compared to the glass hollow microspheres (D50=20 μm), the addition of the silicon dioxide hollow microspheres is less likely to affect the dielectric loss of the dielectric substrate layer. Even when a large amount of the silicon dioxide hollow microspheres are present, the dielectric loss of the dielectric substrate layer can still be lower than 0.0035. In addition, an addition of the spherical SiO₂ fillers can adjust the dielectric constant, the dielectric loss, and the thermal expansion coefficient of the dielectric substrate layer.

Referring to Table 3, components of the resin composition of Examples 11 to 14 are listed therein. Unless otherwise indicated, units in Table 3 are parts by weight. The reinforcing substrate is immersed into the resin composition in each of Examples 11 to 14 and is then semi-cured to form the prepreg. After thermo compressing the prepreg, the dielectric substrate layer is formed. Subsequently, the transition temperature, the coefficient of thermal expansion, the moisture absorption rate, the dielectric constant, the dielectric loss, and a flammability of the dielectric substrate layer are measured and listed in Table 3.

In Table 3, the purity of the material of the silicon dioxide hollow microspheres (D50=7.5 μm) and a purity of a material of the silicon dioxide hollow microspheres (D50=17 μm) are higher than or equal to 99.8%, and said materials each have a metal content lower than 0.2 wt % (an amount of sodium being lower than 0.1 wt % and an amount of calcium being lower than 0.1 wt %). The material of the glass hollow microspheres (D50=20 μm) contains 2.5 wt % of sodium and 4.8 wt % of calcium. The purity of the material of the spherical $SiO_2$ fillers (D50=5 μm), a purity of a material of corniculate $SiO_2$ fillers (D50=5 μm), and a purity of a material of the corniculate $SiO_2$ fillers (D50=15 μm) are higher than or equal to 99.8%, and said materials each have a metal content lower than 0.2 wt % (an amount of sodium being lower than 0.1 wt % and an amount of calcium being lower than 0.1 wt %).

TABLE 3

| (phr) | | Example | | | |
|---|---|---|---|---|---|
| | | 11 | 12 | 13 | 14 |
| Polymeric based material | Polyphenylene ether resin | 24 | 24 | 24 | 24 |
| | Hardener | 11 | 11 | 11 | 11 |
| | Polybutadiene | 5 | 5 | 5 | 5 |
| | Flame retardant | 5 | 5 | 5 | 5 |
| | Catalyst | 0.75 | 0.75 | 0.75 | 0.75 |
| Hollow fillers | $SiO_2$ hollow microspheres (D50 = 7.5 μm) | 10 | — | — | — |
| | (vol %) | 50% | — | — | — |
| | $SiO_2$ hollow microspheres (D50 = 17 μm) | — | 10 | 10 | 10 |
| | (vol %) | — | 40% | 40% | 40% |
| | Glass hollow microspheres (D50 = 20 μm) | 3.5 | 3.5 | 3.5 | 3.5 |
| | (vol %) | 10% | 10% | 16% | 16% |
| Solid fillers | Spherical $SiO_2$ fillers (D50 = 5 μm) | 45 | 45 | — | — |
| | (vol %) | 16% | 26% | — | — |
| | Corniculate $SiO_2$ fillers (D50 = 5 μm) | — | — | 45 | — |
| | (vol %) | — | — | 20% | — |
| | Corniculate $SiO_2$ fillers (D50 = 15 μm) | — | — | — | 45 |
| | (vol %) | — | — | — | 20% |
| Transition temperature (° C.) | | 208 | 215 | 215 | 215 |
| CTE (ppm/° C.) | | 1.55 | 1.29 | 1.22 | 0.73 |
| Moisture absorption rate (%) | | 0.42 | 0.33 | 0.35 | 0.33 |
| Dk (10 GHz) | | 3.29 | 3.18 | 3.07 | 3.12 |
| Df (10 GHz) | | 0.0027 | 0.0029 | 0.003 | 0.003 |
| Flammability | | V0 | V0 | V0 | V0 |

According to results of Table 3, due to the silicon dioxide hollow microspheres (D50=7.5 μm) added in the resin composition, the dielectric substrate layer in each of Examples 11 to 14 can have a lower dielectric loss (lower than 0.0035). When the silicon dioxide hollow microspheres and the glass hollow microspheres are concurrently added into the resin composition, the dielectric constant of the dielectric substrate layer can be reduced.

In addition, passive intermodulation of the dielectric substrate layer made from the resin composition in each of Examples 2, 5, 7, and 9 are measured at 1900 MHz and listed in Table 4.

TABLE 4

| | Passive intermodulation (1900 MHz) |
|---|---|
| Example 2 | −155 dBc |
| Example 5 | −165 dBc |
| Example 7 | −166 dBc |
| Example 8 | −165 dBc |
| Example 9 | −162 dBc |

According to results of Table 4, the passive intermodulation of the dielectric substrate layer made from each of the resin compositions of the present disclosure is lower than or equal to −155 dBc. In other words, as an electrical signal passes through the dielectric substrate layer of the present disclosure, signal interference is less likely to occur as a result of the materials used.

Beneficial Effects of the Embodiments

In conclusion, in the resin composition, the prepreg and the printed circuit board provided by the present disclosure, by virtue of "1 vol % to 80 vol % of the fillers including hollow fillers" and "a material of the first hollow filler being silicon dioxide", the thermal stability of the prepreg and the dielectric substrate layer can be enhanced, and the dielectric loss of the prepreg and the dielectric substrate layer can be reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A resin composition, which is used to form a dielectric substrate layer, comprising 10 vol % to 60 vol % of a polymeric based material and 1 vol % to 80 vol % of fillers based on a total volume of the resin composition being 100 vol %, wherein the fillers include hollow fillers, the hollow fillers include a first hollow filler, and a material of the first hollow filler is silicon dioxide, wherein a volume ratio of the first hollow filler to the second hollow filler is 0.8 to 5.

2. The resin composition according to claim 1, wherein the first hollow filler has an average particle size of 5 μm to 20 μm.

3. The resin composition according to claim 1, wherein the first hollow filler has a specific weight of 0.3 to 1.5.

4. The resin composition according to claim 1, wherein the first hollow filler has a purity of higher than or equal to 99.8%.

5. The resin composition according to claim 1, wherein the hollow fillers include a second hollow filler, and a material of the second hollow filler is selected from the group consisting of borosilicate, glass, white sand, pulverized fuel ash, and metal silicate.

6. The resin composition according to claim 1, wherein the material of the first hollow filler has a metal content lower than 0.2 wt %.

7. The resin composition according to claim 1, wherein the hollow fillers include a third hollow filler, and a material of the third hollow filler is selected from the group consisting of acrylonitrile, vinylidene chloride, a phenol resin, an epoxy resin, and a urea resin.

8. The resin composition according to claim 1, wherein the fillers include solid fillers, and the fillers include 1 vol % to 79 vol % of the solid fillers and 1 vol % to 79 vol % of the hollow fillers.

9. The resin composition according to claim 8, wherein the solid fillers include a first solid filler, and a material of the first solid filler is selected from the group consisting of:

silicon dioxide, titanium dioxide, strontium titanate, barium titanate, potassium titanate, zinc silicate, magnesium silicate, calcium silicate, aluminum nitride, boron nitride, silicon nitride, silicon carbide, aluminum oxide, magnesium oxide, zirconium oxide, beryllium oxide, zinc oxide, aluminum hydroxide, magnesium hydroxide, zinc borate, glass, kaolinite, talcum powder, mica powder, hydrotalcite, mullite, and quartz.

10. The resin composition according to claim 8, wherein the solid fillers include a second solid filler, and a material of the second solid filler is selected from the group consisting of: polytetrafluoroethylene powder, polyphenylene sulfide powder, polystyrene powder, polyethylene powder, polypropylene powder, liquid crystal polymer powder, polyetheretherketone powder, graphite powder, and graphene powder.

11. A prepreg formed by immersing a reinforcing substrate into the resin composition as claimed in claim 1.

12. A printed circuit board, comprising the dielectric substrate layer and a conductive metal layer formed on the dielectric substrate layer, wherein the dielectric substrate layer is formed from the prepreg as claimed in claim 11.

13. The printed circuit board according to claim 12, wherein a dielectric constant of the dielectric substrate layer at 10 GHz is lower than 3.4, and a dielectric loss of the dielectric substrate layer at 10 GHz is lower than 0.0045.

14. The printed circuit board according to claim 12, wherein a passive intermodulation of the dielectric substrate layer is lower than or equal to −155 dBc.

\* \* \* \* \*